United States Patent [19]

Muller et al.

[11] Patent Number: 4,849,695

[45] Date of Patent: Jul. 18, 1989

[54] NULL-DETECTION MAGNETOMETERS

[75] Inventors: Richard S. Muller, Kensington; Juan I. Coicolea, Berkeley, both of Calif.

[73] Assignee: University of California, Berkeley, Calif.

[21] Appl. No.: 259,128

[22] Filed: Oct. 18, 1988

Related U.S. Application Data

[62] Division of Ser. No. 869,581, Jun. 2, 1986, Pat. No. 4,801,883.

[51] Int. Cl.$^4$ ................... G01R 33/06; G01R 33/02
[52] U.S. Cl. ................................ 324/252; 324/244; 324/249; 357/27; 307/309
[58] Field of Search ............... 324/244, 249, 239, 251, 324/252, 260, 262, 258; 307/309; 328/5; 357/26, 27, 35, 36, 68

[56] References Cited

U.S. PATENT DOCUMENTS

| | | | |
|---|---|---|---|
| 3,679,969 | 7/1972 | Fussell | 324/249 X |
| 4,339,715 | 7/1982 | Bloodworth et al. | 324/252 |
| 4,801,883 | 1/1989 | Muller et al. | 324/252 |

OTHER PUBLICATIONS

Garriss et al., "Barkhausen Noise Measuring Device for Magnetoresistive Heads", *IBM-TDB*, vol. 21, No. 3, Aug. 1978, pp. 1163-1165.

*Primary Examiner*—Reinhard J. Eisenzopf
*Assistant Examiner*—Warren S. Edmonds
*Attorney, Agent, or Firm*—Owen, Wickersham & Erickson

[57] ABSTRACT

An integrated-circuit one-way isolation-coupler for a controlling electrical circuit and a controlled electrical circuit and improvements in carrier-domain magnetometers and other applications thereof. In the isolator a magnetic-field source, such as a flat coil, produces a magnetic field from current applied from the controlling circuit, while a detector such as a carrier-domain-magnetometer detects the magnetic field so produced and produces a signal therefrom. A dielectric medium, such as silicon dioxide or silicon nitride separates the source from the detector. The source, the detector, and the dielectric medium, are all incorporated on a single IC chip, such as silicon, or gallium arsenide, or semiconductor material. An amplifier may also be incorporated and may deliver the amplified signal to the controlled circuit. Preferably there are two carrier-domain-magnetometers located so that they are symmetrical with respect to the flat coil.

3 Claims, 9 Drawing Sheets $$B_1 = -B_2 = F \frac{\mu_0 I_{coil}}{W}$$

FIG. 6
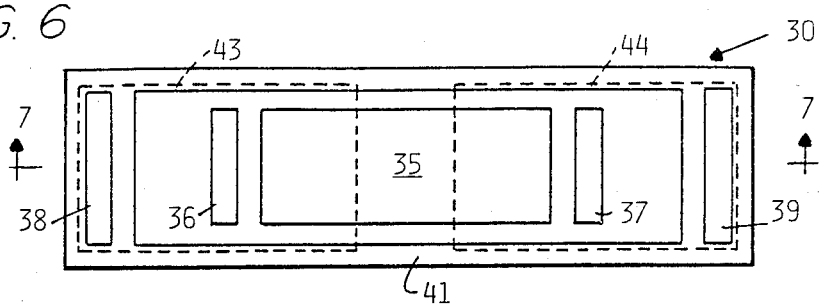
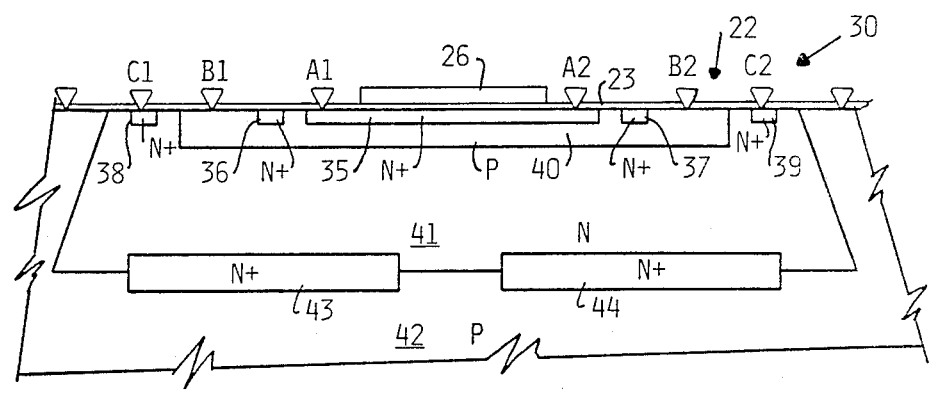
FIG. 7
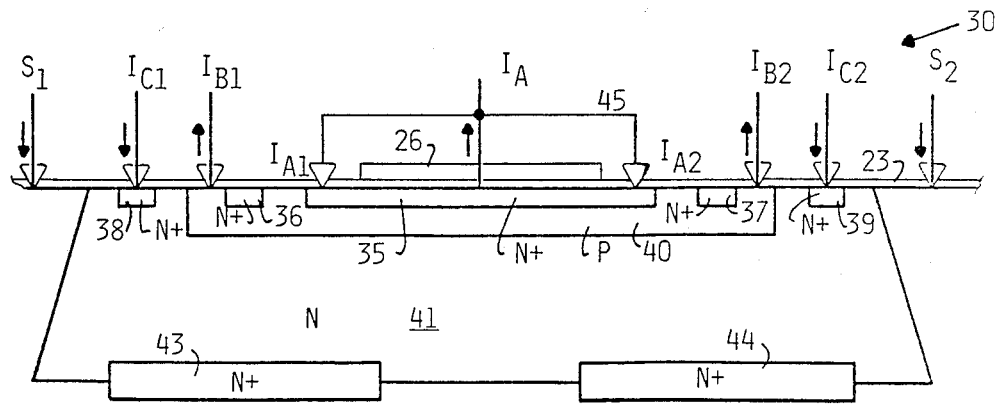
FIG. 8

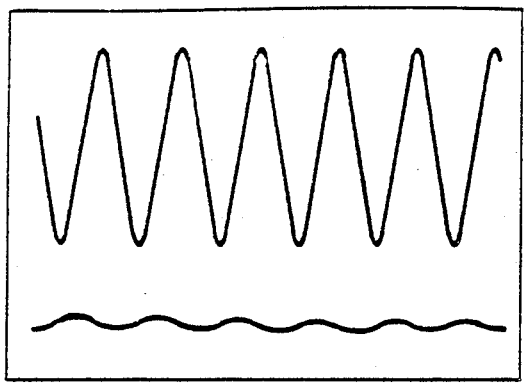
FIG. 9
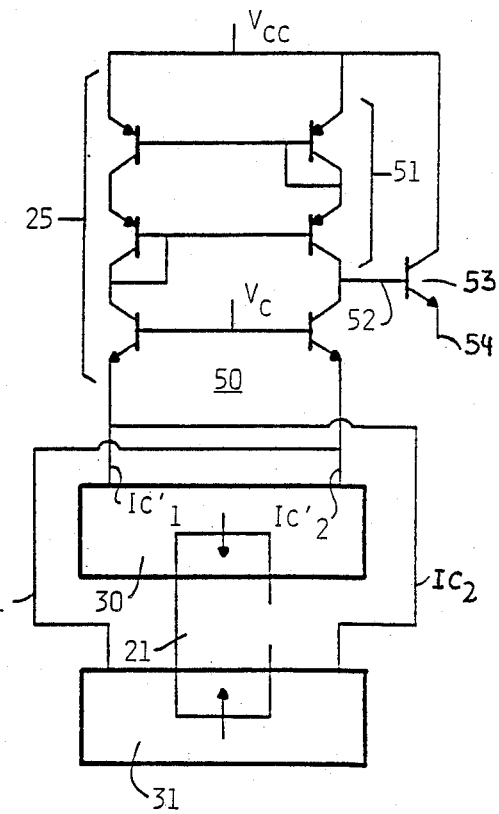
FIG. 10
FIG. 18
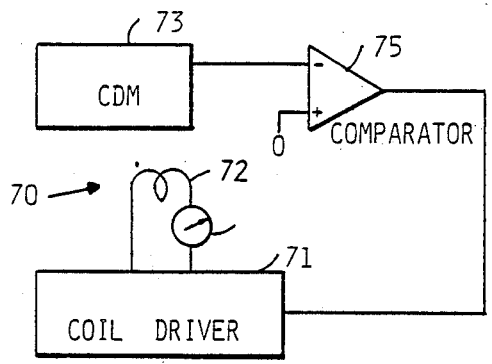
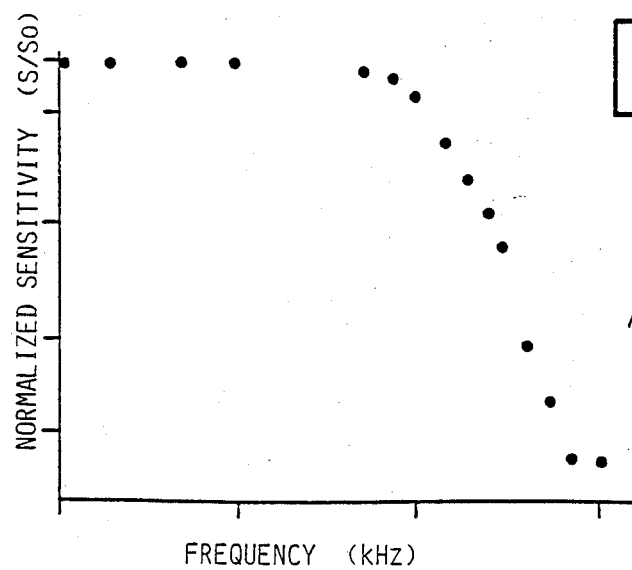
FIG. 11

NULL-DETECTION MAGNETOMETERS

This invention was made with Government support under Grant No. ECS-8120562 awarded by the National Science Foundation. The government has certain rights in this invention.

This is a divisional of co-pending application Ser. No. 869,581 filed on June 2, 1986.

This invention relates to improvements in isolation couplers. More particularly it relates to a new integrated-circuit isolation coupler employing one or two sensitive carrier-domain-magnetometers. It also relates to improved carrier-domain-magnetometers and their use.

BACKGROUND OF THE INVENTION

Many electronic applications require some form of electrical isolation in order to protect circuits from large voltage spikes, as for example, may be encountered in industrial controls. Electrical isolation avoids ground loops that significantly increase system noise, and isolation also serves to link signals between circuits having large offsets in DC voltage levels.

Heretofore, such isolation has often been done by using opto-couplers, in which, typically light-emitting diodes and optical sensors are employed. Opto-couplers require hybrid fabrication techniques, and are therefore more expensive than pure silicon integrated circuits.

Thus, it is an object of the present invention to provide electrical isolation of connected circuits without having to employ opto-couplers.

Another object is to provide electrical isolation by means of a magnetic coupling system.

Another object of the invention is to provide a more versatile and, at the same time, less expensive technology in the field of electrical isolation couplers.

Another object is to avoid hybrid technologies and to construct an isolator using only silicon technology.

Other objects are to eliminate the influence of stray magnetic fields in a magnetic coupler-isolator, to provide for a self-calibrating magnetometer, to improve magnetometer sensitivity, and to reduce the sensitivity to temperature.

A further object is to reduce or eliminate signal offsets in carrier-domain-magnetometers, which are caused by asymmetry in the magnetometer. Offsets have been a problem in carrier-domain-magnetometers. (An input offset is the input required for zero output. Offsets in carrier-domain-magnetometers have been mainly due to spatial misalignments between the different layers in the device. The problem of offsets is complicated by the difficulty of aligning the buried layer in bipolar integrated-circuit technologies with the rest of the masks.

Still other objects and advantages of the invention will appear from the following description.

SUMMARY OF THE INVENTION

The magnetic coupler is similar in concept to an opto-coupler, but in a magneto-coupler a magnetic field is used to communicate between two dielectrically isolated circuits.

An integrated-circuit one-way isolation-coupler of this invention comprises a magnetic-field source (such as a flat coil) for producing a magnetic field from current applied by a controlling circuit, a magnetic-field detector, preferably comprising a carrier-domain-magnetometer, for detecting the magnetic field produced by the source means, and producing a signal therefrom, and a dielectric separator for separating the source means from the detector.

All these elements are incorporated on a single chip, preferably of silicon, which may also include an amplifier for amplifying the signal and delivering it to a controlled circuit.

The circuit is generally functionally similar to an opto-coupler, in that the signal can be transferred to a DC-isolated circuit. However, in contrast to an opto-coupler, both the transmitter and the receiver for the magneto-coupler are built using an analog (e.g., linear) bipolar integrated circuit (IC) process. For example, a fully integrated sense amplifier employing the invention has been made with two carrier-domain-magnetometers (CDM) sensors to produce a signal coupler having a bandwidth of 250 kHz. Such a circuit employs two cross-coupled CDMs that share a common amplifier. Any external magnetic field, produced by sources not on the IC chip and therefore distant from the sensors, induces identical signals in each sensor, and these are, of course, canceled. The local field produced by the flat coil induces signals of opposite polarities on the sensors, and these are added.

Carrier-domain-magnetometers (CDMs) are npnp or pnpn devices that use the regeneration inherent in the structure to obtain great sensitivity to magnetic fields. In a CDM the current is carried by injected holes and electrons that are concentrated in a dense plasma resulting from the interaction of base resistance and junction injection.

Sensitivity to temperature was a problem with previous CDM devices, because these structures have a high temperature coefficient, which may, for example, be about 3% per degree centigrade. A regenerating structure makes it difficult to obtain an accurate model for this dependence. This invention includes a magnetometer incorporating a flat autocalibration coil in order to compensate for temperature effects.

The device of this invention can use a conventional analog (or linear) bipolar production line, and can be embodied in several different types of signal processing circuits. The substrate in this CDM can be grounded or voltage-biased (instead of current-sourced, as in earlier made experimental CDM devices) without affecting its operation. The CDM thus is made compatible with on-chip circuitry. Hole current from the substrate is self limiting because of the substrate resistance and the low injection efficiency of the substrate-to-epitaxial junction.

The aperture of the buried layer is a defining feature of the CDM, and this is structured in this invention to minimize offsets. The base and emitter diffusions are made considerably wider than this opening or aperture, and this reduces the importance of misalignment errors on CDM operation. Preferably, two extra emitter diffusions are included to increase regeneration, and therefore to improve sensitivity, when injecting a current through them. However, these extra emitters do increase the offset, since they are not self aligned to the opening in the buried layer.

The circuit preferably includes a flat coil which is patterned in an interconnect layer and is dielectrically isolated from the rest of the circuit by a layer of insulating material, typically silcon dioxide, silicon nitride, or other similar material. Current passing through this coil generates a local magnetic field in the CDM that is superimposed on any external magnetic field. The sensor response is linear, so that the output signal has a component corresponding to the local field. This output signal is used to calibrate the CDM automatically by controlling the gain of the amplifier, enabling the magnetometer to maintain constant sensitivity. The calibration coil can also be used to obtain a null-detection magnetometer in which the feedback circuit drives the coil until it cancels the external field.

The magneto-coupler provides an isolator which can be fabricated by using conventional IC processing. The magneto-coupler is made especially useful because of the wide dynamic range in linear response of the novel type of carrier-domain-magnetometer provided by this invention.

The invention also enables the use of a configuration incorporating an array of four magnetic sensors sharing a common amplifier. These can be selectively switched on and off.

BRIEF DESCRIPTION OF THE DRAWINGS

FIG. 6 is a greatly enlarged top plan layout view of a carrier-domain-magnetometer embodying the principles of the invention.

FIG. 7 is a view in cross-section of the CDM taken along the line 7—7 in FIG. 6.

FIG. 8 is a diagrammatic view showing the biasing and operation of the CDM of FIGS. 6 and 7.

FIG. 9 is a cathode ray oscilloscope track showing a sensitivity reduction of the coupler to extraneous magnetic fields. The top trace is measured directly on a single sensor, and the bottom trace, which is only about 10% as large, is an output with differential detection.

FIG. 10 is a circuit diagram for the magneto-coupler embodying the principles of the present invention. The bias circuit for the CDMs has been omitted for the sake of clarity.

FIG. 11 is a graph of sensitivity against frequency of a signal applied to the magneto-coupler of FIG. 10.

FIG. 18 is a block diagram of a null-detection magnetometer.

DESCRIPTION OF A PREFERRED EMBODIMENT

Figure 1:
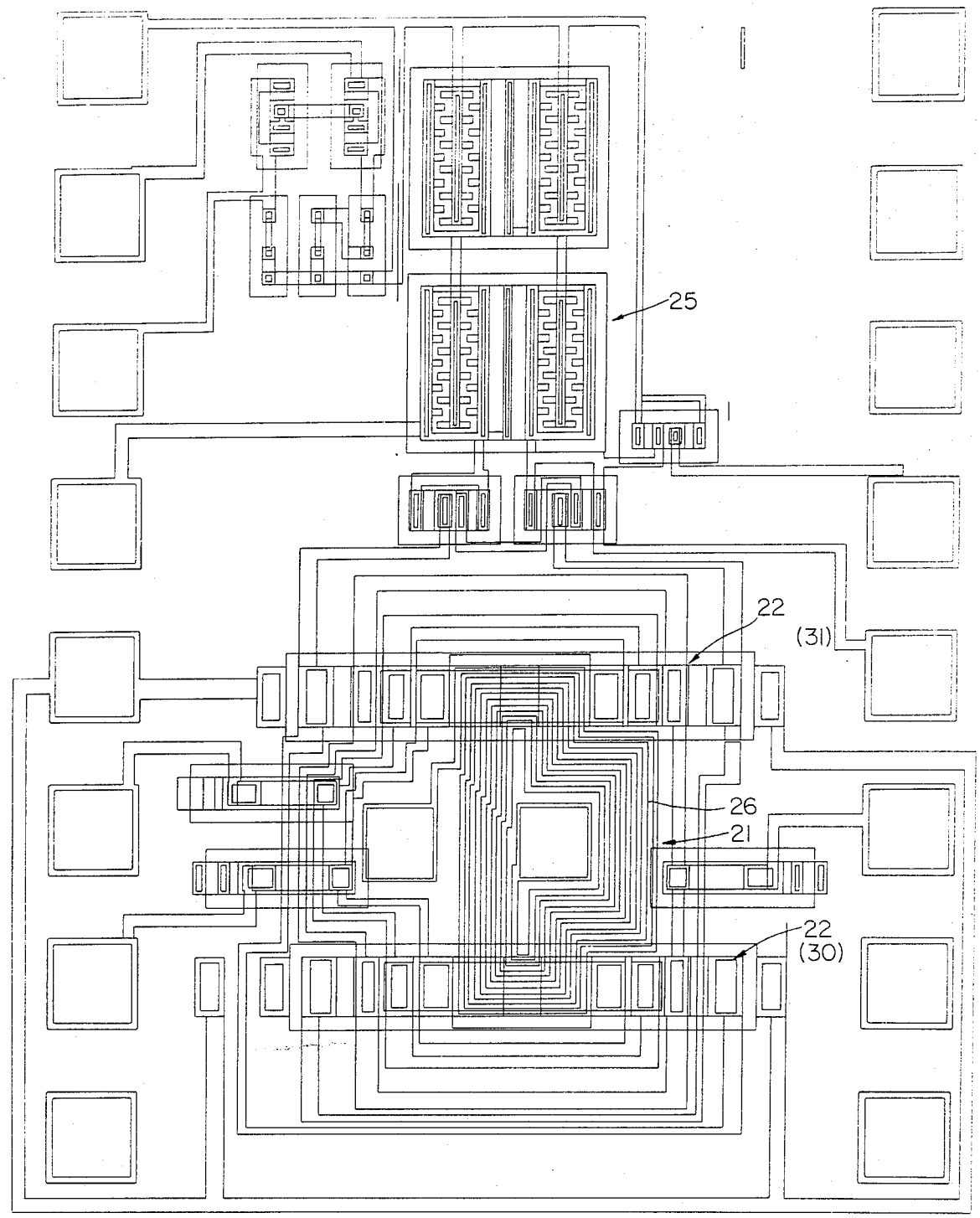
FIG. 1 is a greatly enlarged top plan view of an integrated circuit embodying a magneto-coupler isolator according to the present invention.
Figure 2:
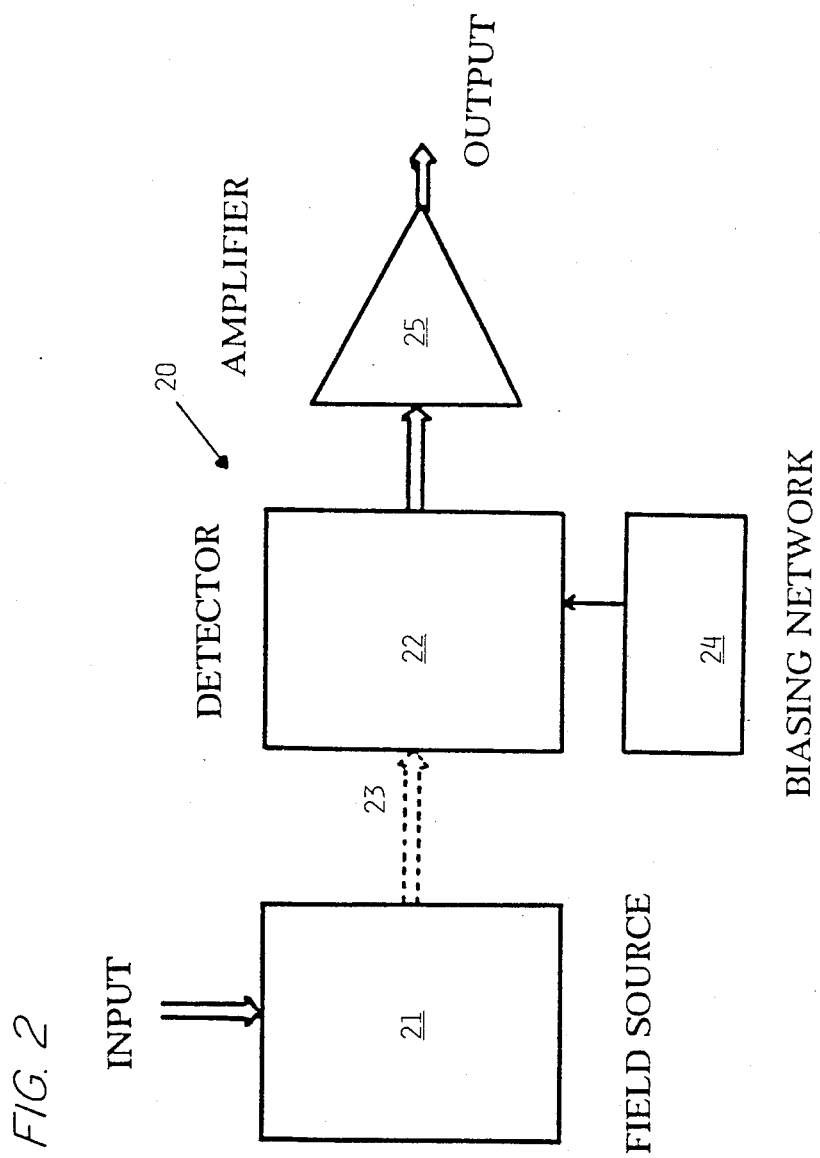
FIG. 2 is a simplified functional diagram of the magneto-coupler isolator of FIG. 1.

A magneto-coupler 20 of this invention, is shown in FIG. 1. As also shown in FIG. 2, it comprises a magnetic-field source 21 and a detector 22, separated by a dielectric medium 23, which may be a thin layer of silicon dioxide or silicon nitride. The detector 22 may, if desired, have a biasing network 24. The magneto-coupler 20 may be and preferably is made as an integrated circuit (IC) employing a thin monolithic sheet of silicon. It may be quite small, about the area of a small fingernail. Preferably, the IC also includes an amplifier 25 for delivery output to a controlled circuit.

The field 21 may be generated by a current in a flat coil 26 (see FIGS. 3–5) patterned as an IC interconnect layer (such as an aluminum metalization layer or a silicide layer) and dielectrically isolated from the rest of the circuit by the layer 23 of silicon dioxide. This layer 23 is about one $\mu$m in thickness and comprises the field oxide. As an example of the invention, the flat coil 26 may have the pitch of 20 $\mu$m (micrometer) and produce a magnetic field of 0.3 Gauss per milliampere (G/mA) at the magnetic sensor 22. The field produced for a given current drive varies inversely with the metal pitch and could therefore be increased by about an order of magnitude without difficulty.

Figure 3:
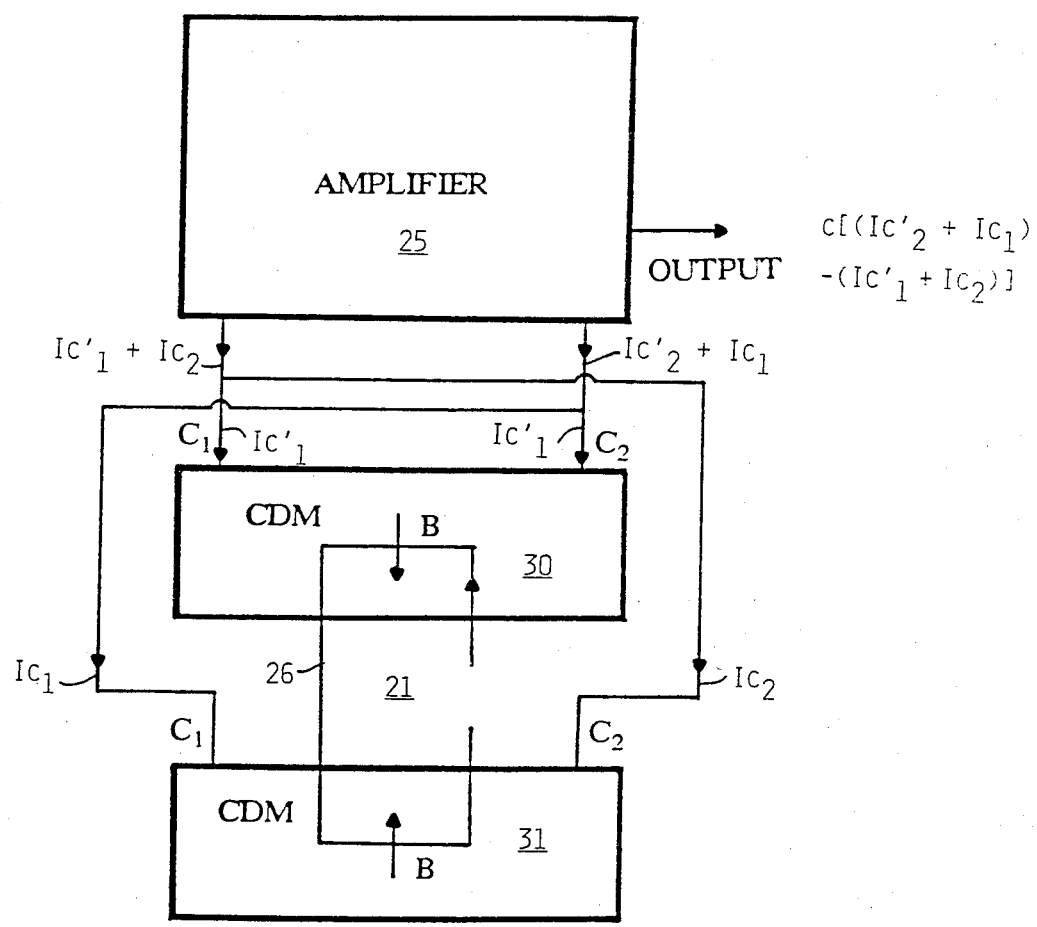
FIG. 3 is a simplified structural diagram of the isolator of FIG. 1, showing two carrier-domain-magnetometers.

Underneath the flat coil 26 is the detector 22, which comprises two carrier-domain-magnetometers (CDMs) 30 and 31, for example, each measuring about $100 \times 800$ $\mu m^2$. FIG. 3 shows how the output from terminal C1 of the CDM 31 is connected to the output from terminal C2 of the CDM 30, and both are connected to the amplifier 25. Similarly, the output for terminal C2 of the CDM 31 is connected to the output from terminal C1 of the CDM 30 and then to the amplifier 25. In this way the outputs are appropriately subtracted.

Figures 4, 5:
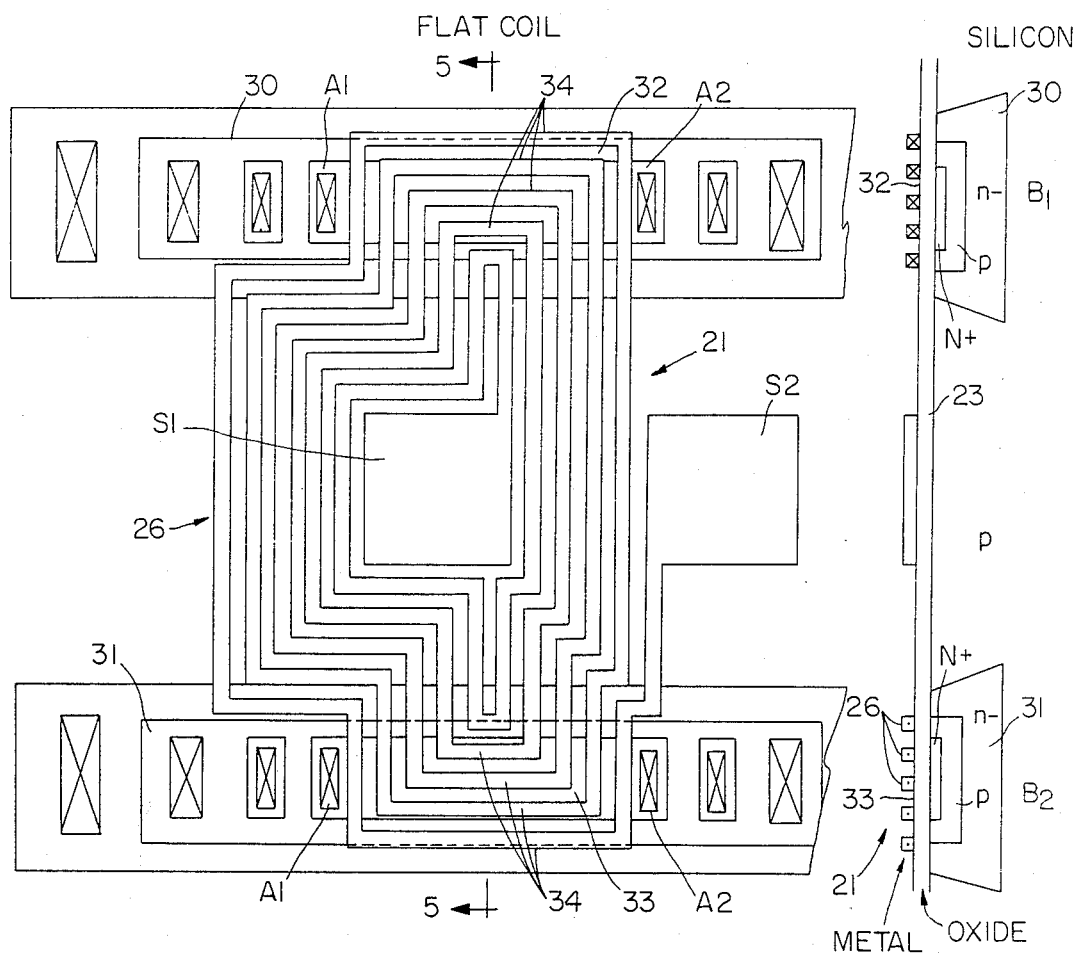
FIG. 4 is a greatly enlarged top plan view of the flat coil of the isolator with the positions of the two carrier-domain magnetometers shown in broken lines.
FIG. 5 is a greatly enlarged, partly diagrammatic, cross-sectional view taken along the line 5—5 in FIG. 4.

FIGS. 4 and 5 show a preferable coil structure, in which the flat coil 26 has two wing areas 32 and 33 that are identical in pattern and size. They each have a series of relatively long parallel segments 34 that are aligned lengthwise to the CDMs 30 and 31 to improve sensitivity, since the field produced by current in the segments 34 is perpendicular to them. The coil 26 has two contacts S1 and S2 for current input.

The CDMs 30 and 31 are each npnp devices using two minority-carrier domains (beams) that flow perpendicularly to the plane of FIG. 4 i.e., vertically with respect to that normally horizontal plane. A main N+heavily doped portion 35 (see FIG. 8) (preferably doped with phosphorus or arsenic) lies directly beneath a coil wing 32 or 33, and has electrical contacts A1 and A2 beyond the coil wing. A magnetic deflection mechanism (described later) for the carrier domain is enhanced by to a regenerative npnp structure, including contacts B1 and B2 with secondary N+portions 36 and 37, and the main output terminals C1 and C2 with additional N+portions 38 and 39. Such devices have been built to detect fields as low as 30 milliGauss (mG), at 1 KHz bandwidth. This field is much smaller than the earth's magnetic field of about 700 mG.

The five heavily doped N+portions 35, 36, 37, 38, and 39 are embedded in a moderately doped base-collector P-layer 40, which rests on the lightly doped N-layer 41, which itself is embedded in the body 42, which preferably is silicon and a P-doped substrate. The dopant for the P-layers is preferably boron, for silicon. Between the N-layer 41 and the P-body 42 are two separate heavily doped N+layers 43 and 44. (It may be noted that the device could be made in reverse with P's replacing the N's and vice versa.)

The npnp structure can be viewed as merged npn and pnp transistors sharing a common base-collector junction 40, 41. During operation this junction is always reverse-biased. The npn transistor comprises the layers 35 (emitter), 40 (base), and 41 (collector). The pnp transistor comprises the layer 42 (emitter), 41 (base), and 42 (collector). The npn transistor 35, 40, 41 is biased by a current source (not shown, but part of the biasing network 24) at its emitter 35, and both transistors are in the forward-active region of operation. Electrons are injected by the emitter 35, to cross the base 40 of the npn transistor, and are collected at the collector 41, of the npn transistor. This npn collector 41 at the same time serves as the base for the pnp transistor. Similarly, holes are injected by the emitter 42 of the pnp transistor, cross the base 41, and are collected in the collector 40 of the pnp transistor, which is also the npn base.

Due to the resistive voltage drops in the bases 40 and 41, as a result of X-axis directed currents, i.e., parallel to the surface of the magnetometer, carrier injection is localized over a very small portion of the base-emitter junction 40, 41, concentrating the current into two narrow beams or domains. The first domain consists of electrons and the second is composed of holes. Detailed analysis of the currents and voltages within the base layers indicates that the injection point of each domain along the x-direction tends to coincide with the point in which the other domain is collected.

When a y-directed magnetic field is present, the Lorentz force $q\bar{v} \times \bar{B}$ deflects both domains in the same direction (along x), due to to the opposite polarities and velocities of the carriers. The tendency of each domain to start at the point where the other one is collected creates a regenerative process that shifts the injection point along the x-direction, greatly multiplying the original deflection, typically 10 to 100 times. This shift is translated into a differential current, $I_{c1}-I_{c2}$ as shown in FIG. 8, that constitutes the output signal. The hole current in the CDMs 30 and 31 is limited to approximately 3-4 mA and is supplied through front contacts 51 and 52 to avoid voltage drops in the substrate 42.

The use of two CDM sensors 30 and 31 below the coil 26 along with the circuitry shown in FIG. 3 implements the subtraction of the signal ($I_{c1}1-I_{c2}1$) of the CDM 31 from the signal ($I_{c1} - I_{c2}$) of the CDM 30, to cancel offset and to compensate for the presence of unintended magnetic fields. Offsets as well as signals produced by external magnetic fields have the same polarity in each CDM 30 and 31, while the local field produced by the coil 26 has opposite polarities; the subtractive technique thus eliminates the offsets and unwanted signals. FIG. 9 shows that this subtractive signal deflection very effectively reduces sensitivity to external fields. FIG. 9 is a cathode ray oscilloscope track showing a sensitivity reduction of the coupler to extraneous magnetic fields. The top trace is measured directly on a single sensor, and the bottom trace, which is only about 10% as large, is an output with differential detection.

The on-chip amplifier 25, shown schematically in FIG. 10, is essentially a current-to-voltage converter. A common base stage 50 is loaded with a Wilson current mirror 51 that converts the differential signal to a single-ended format voltage 52. The voltage 52 is buffered through an emitter-follower stage 53 to produce the output 54 of the magnetometer 20. The current mirror 51 and the emitter-follower 53 are with a suitable voltage $V_{cc}$, which may be about 15 volts and voltage $V_c$, which may be about 14 volts and can be obtained by the main supply voltage $V_{cc}$ by a voltage divider.

Sensitivity to external fields is reduced by a factor of 10 when using the differential configuration that is shown in FIG. 10. Higher rejection ratios can be obtained by separately trimming the bias currents and therefore separately adjusting the sensitivity of each CDM 30, 31.

The biasing network 24 for the CDMs 30 and 31 may include a current source and a negative voltage supply for the emitter and base regions of the CDMs 30 and 31.

The magneto-coupler 20 may be fabricated on a commercial production line. For example, a nine $\mu$m epitaxial linear bipolar process may be used.

Figure 12:
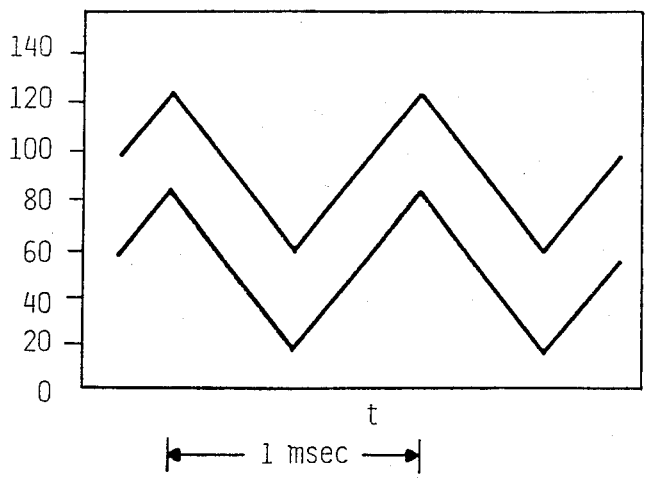
FIG. 12 is a diagrammatic view of the response of the magneto-coupler of FIG. 10 to a one-kHz triangular current wave form applied to the flat coil of the magneto-coupler. The lower trace shows the current through the coil at a rate of 20 milliamps per division. The upper trace is the coupler output processed by an on-chip current-to-voltage converter.
Figure 13:
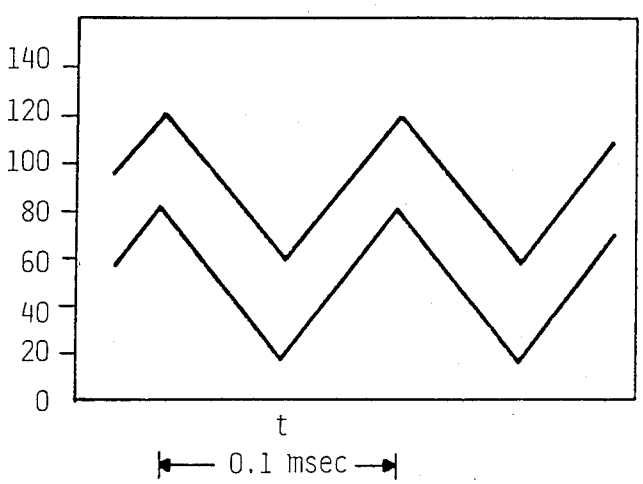
FIG. 13 is a view similar to FIG. 12 showing the magneto-coupler response to a 50 kHz triangular current source input.
Figure 14:
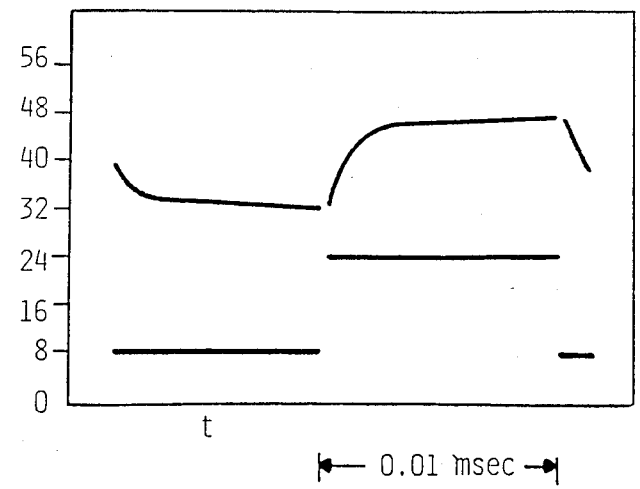
FIG. 14 is a view similar to FIG. 12 showing the magneto-coupler response to a current source input of a 50 kHz square wave.

In some tests, as shown in FIG. 11, the measured bandwidth of the magnetic coupler 20 was 250 kHz. In another CDM made according to this invention, the band width of the magnetic sensor was 300 kHz. The upper frequency limit is consistent with the predicted transit time through the 8 $\mu$m base thickness of the vertical pnp transistor making up the CDM. Transient response is shown in FIG. 14 to correspond to a one-dominant pole system and corroborates the data shown in FIG. 11. Regeneration in the device reduces the band width approximately to the frequency corresponding to the reciprocal of transit time, divided by the regenerative gain $[(1/\tau) \div \text{Gain}]$, which is about 30 in tested structures. Bipolar processes for faster devices can yield significantly greater band width. The coupler output depends linearly on the current in the flat coil 26 and responds to DC signals applied to the coil; so that it is suitable for analog applications. Measurements shown in FIGS. 12 and 13 demonstrate this linearity. FIG. 12 is a diagrammatic view of the response of the magneto-coupler of FIG. 10 to a one-kHz triangular current wave form applied to the flat coil of the magneto-coupler. The lower trace shows the current through the coil at a rate of 20 milliamps per division. The upper trace is the coupler output processed by an on-chip current-to-voltage converter. FIG. 13 is a view similar to FIG. 12 showing the magneto-coupler response to a 50 kHz triangular current source input. The measured minimum detectable input current in the coupler 20 was approximately 250 $\mu$Amps at the 1 kHz bandwidth.

The sensitivity of the CDM in some tests was found to be 1.2 $\mu AG^{-1}$ with a 7 mA drive, without using additional emitters in the CDM structure. A typical value for offset corresponds to 100 G. Measured noise in the device was 30 mG for a bandwidth of 1 kHz under a 7 mA bias at room temperature. Preliminary measurements indicated that the noise was spread nearly uniformly across the pass band, and would therefore be called white noise.

Unlike a transformer, the magneto-coupler 20 of this invention responds directly to the signal and not to its derivative; therefore it responds to a DC signal.

Figure 16:
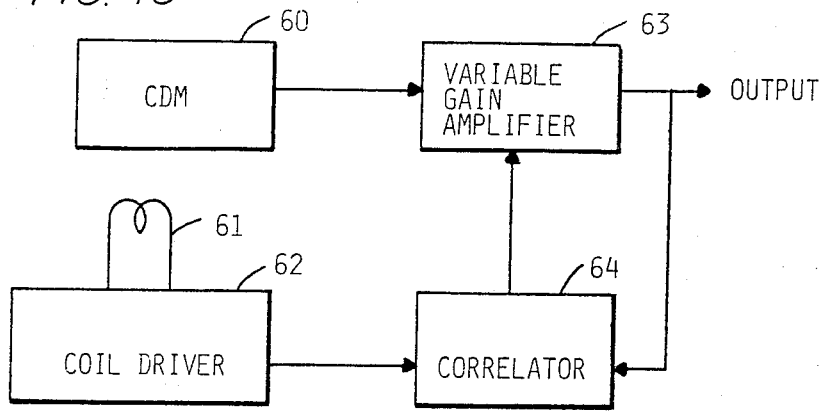
FIG. 16 is a block diagram of the device of FIG. 15, combined with a correlator.
Figure 15:
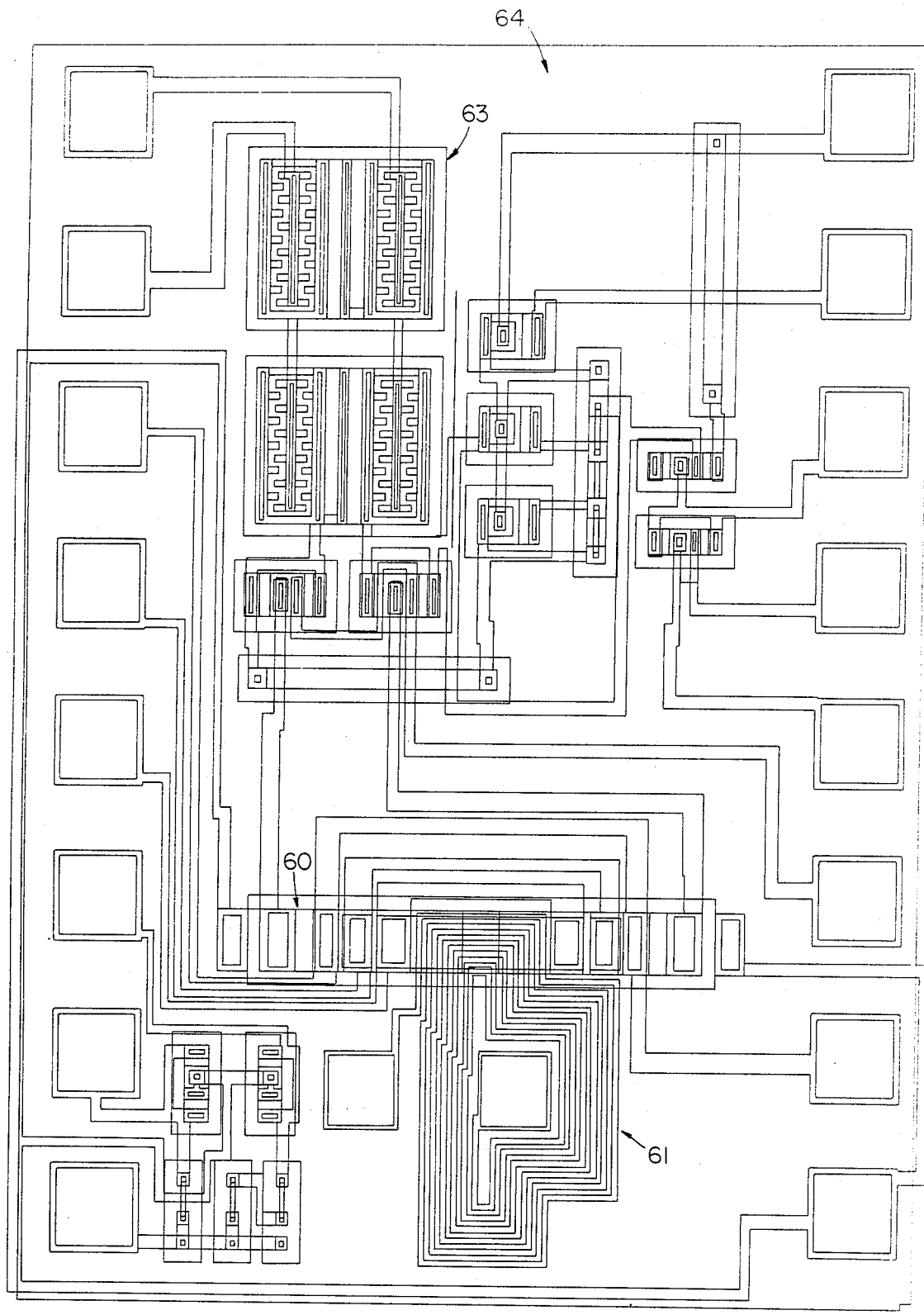
FIG. 15 is a top plan view of an auto-calibrated carrier-domain-magnetometer in combination with a variable-gain on-chip amplifier.

FIGS. 15 and 16 show how a CDM 60 (like the CDM 30 or 31) can be autocalibrated by using a flat coil 61 to create a reference magnetic field. The coil 61 is energized by a coil driver 62, and the signal from the CDM 60 goes to a variable gain amplifier 63 on the same IC chip 64. A correlator 65, which may be on the same chip 64, correlates the reference signal injected into the coil by the coil driver 62 with the output from the amplifier 64, deriving the signal that controls the gain of the amplifier 63.

The autocalibration feature has been tested at temperatures up to 100°C. with no measurable variation in sensitivity.

A null-detector magnetometer 70 is shown in block diagram form in FIG. 18. A coil driver 71 energizes a flat coil 72 in such a way that the field produced by the coil 72 cancels the field applied to a CDM 73. Since the current required for this cancellation is proportional to the field strength of the cancelled field, this magnitude constitutes the output signal 74. A comparator 75 assures that the output signal 74 is zero.

Figure 17:
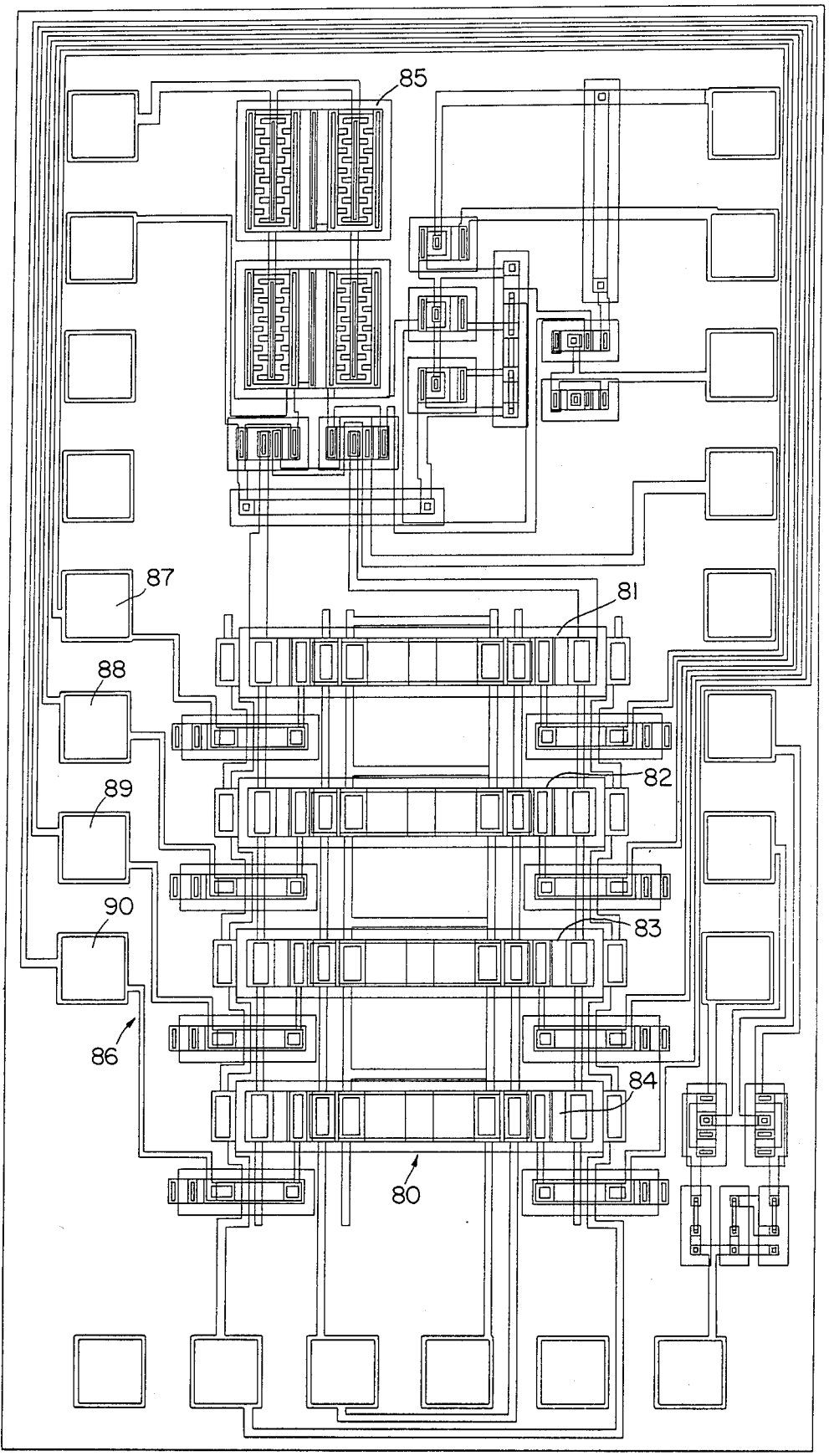
FIG. 17 is a top plan view of an array of carrier-domain-magnetometers and related circuitry.

FIG. 17 shows an array 80 of four carrier-domain-magnetometers 81, 82, 83, and 84 integrated with a common amplifier 85 and digital addressing circuitry 86 having contacts 87, 88, 89, and 90, all on a body 91 of silicon. Thereby, the magnetometer can be separately addressed.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. A null-detection magnetometer for providing stability at different temperatures and linearity of output current, comprising, magnetic-field source means for producing a magnetic field from current applied thereto, magnetic-field detecting means for detecting the magnetic field produced by said source means and producing a signal therefrom, dielectric separation means for separating said source means from said detecting means, a driver connected to said source for supplying current thereto, a comparator connected to said detecting means at an input and to said driver at the output, for comparing said signal with a reference, and output means connected to said driver, said comparator regulating said driver to produce a zero net output wherein said detecting means comprises a carrier-domain-magnetometer.

2. The magnetometer of claim 1 wherein said source means, said detecting means, said separation means, said comparator, and said driver and said output means are all incorporated on a single IC chip.

3. The null-detection magnetometer of claim 1 wherein said source means comprises a flat coil patterned in an IC interconnect layer on said separation means.

* * * * *

UNITED STATES PATENT AND TRADEMARK OFFICE
CERTIFICATE OF CORRECTION

PATENT NO. : 4,849,695
DATED : July 18, 1989
INVENTOR(S) : Muller, Richard S., Goicolea Juan I.

It is certified that error appears in the above-identified patent and that said Letters Patent is hereby corrected as shown below:

On the title page, in item [75]:

Please change "Juan I. Colcolea" to the correct spelling of - - Juan I. Goicolea - -.

Signed and Sealed this

Eighth Day of December, 1992

Attest:

DOUGLAS B. COMER

Attesting Officer

Acting Commissioner of Patents and Trademarks